United States Patent [19]

Hinckley

[11] Patent Number: 4,777,479

[45] Date of Patent: Oct. 11, 1988

[54] SWITCH POSITION INDICATOR

[75] Inventor: Paul Hinckley, Nassau, N.Y.

[73] Assignee: Unisys Corporation, Blue Bell, Pa.

[21] Appl. No.: 33,711

[22] Filed: Apr. 3, 1987

[51] Int. Cl.$^4$ ............................................. G08B 21/00
[52] U.S. Cl. .................................. 340/644; 340/638; 200/308
[58] Field of Search ............... 340/644, 686, 638, 687; 324/133, 422; 200/308, 310, 312; 315/131, 133

[56] References Cited

U.S. PATENT DOCUMENTS 4,672,310  6/1987  Sayed ................................. 340/644
4,691,143  9/1987  Lange ................................. 340/644

Primary Examiner—Joseph A. Orsino, Jr.
Assistant Examiner—Jeffery A. Hofsass
Attorney, Agent, or Firm—Albert B. Cooper; Arnold L. Albin; Laurence J. Marhoefer

[57] ABSTRACT

A remote indicator for displaying the position of a power control switch whether or not power is applied to the switch. An auxiliary DC power supply provides a reference potential to a plurality of voltage dividers. One voltage divider provides a first reference potential to a comparator. A second voltage divider and the reference power supply are connected through the power control switch so that a second reference potential is applied to the comparator when the power switch is closed. Differences of the two reference potentials corresponding to the open and closed switch positions are sensed by the comparator and used to activate an indicator accordingly.

7 Claims, 1 Drawing Sheet

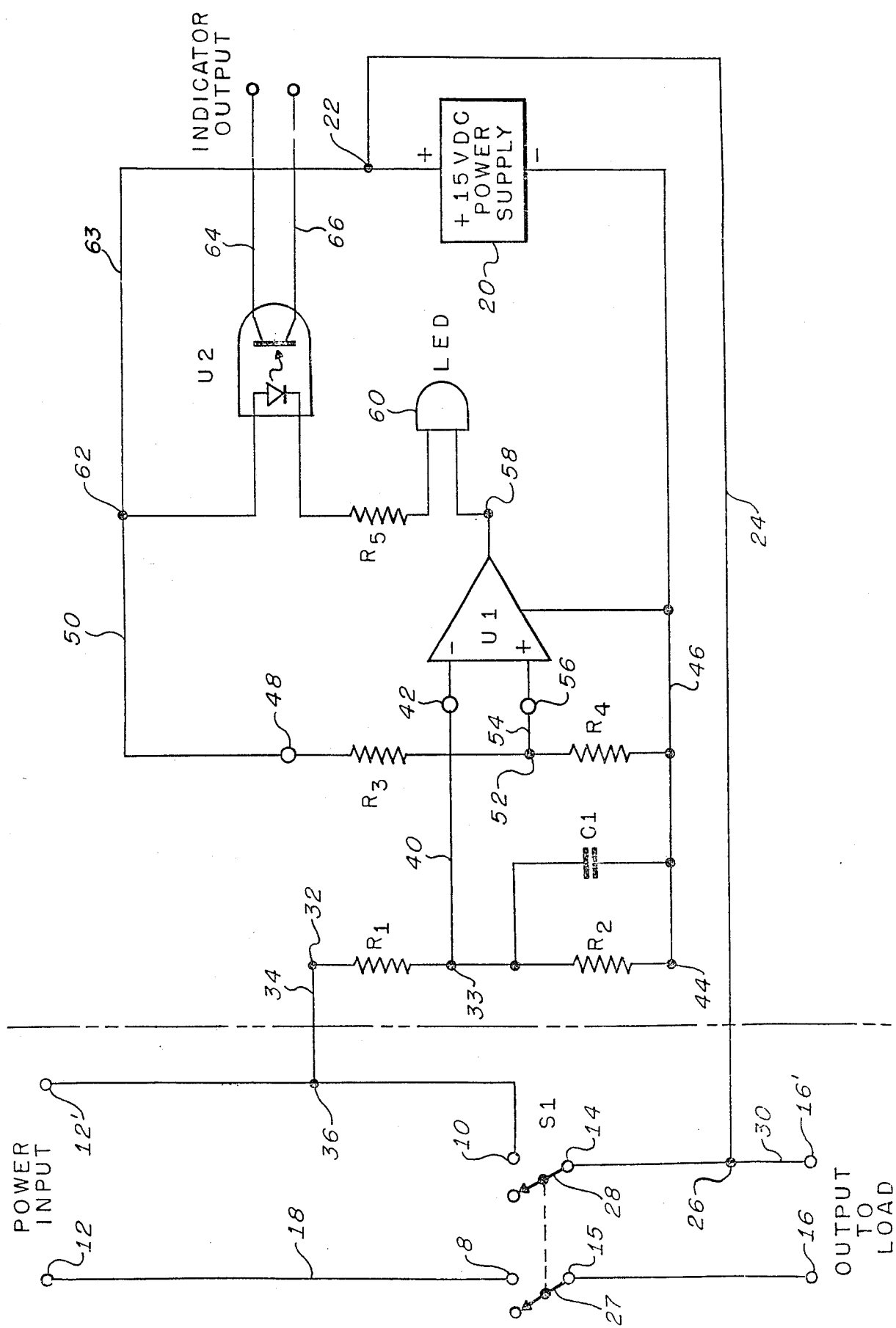

SWITCH POSITION INDICATOR

The United States Government has rights in this invention under Contract N00024-84-C-4003.

BACKGROUND OF THE INVENTION

1. Field of the Invention

The present invention is directed towards an indicator for displaying the position of a power switch, and more particularly to a remote indicator which can be used with an ordinary switch and requires no modification of the power switch itself. The circuit indicates the switch position whether or not power is applied to the switch.

SUMMARY OF THE INVENTION

An auxiliary dc power supply provides a reference potential to a plurality of voltage dividers. One voltage divider is so constructed and arranged as to provide a first reference potential to a detector in the form of a comparator. A second voltage divider and the reference power supply are connected through the power control switch so that a second reference potential is applied to the detector when the power switch is closed. Differences of the two reference potentials corresponding to the open and closed switch positions are sensed by the detector and used to activate an indicator accordingly.

BRIEF DESCRIPTION OF THE DRAWING

The sole FIGURE is a schematic circuit diagram of a preferred embodiment of the present invention.

DESCRIPTION OF THE PREFERRED EMBODIMENT

The sole FIGURE is a schematic circuit diagram of a circuit for remotely indicating the position of a power control switch. The circuit indicates the switch position whether or not power is applied to the control switch. A double pole power switch S1 has terminals 8 and 10 connected to a source of power 12,12' and terminals 14, 15 connected to provide the power output to a load, not shown, at terminals 16,16'. Line 18 provides a connection between the power source input terminal 12 and the load terminal 16 for DC or single phase power supplies. For multiple phase supplies, as for three phase, 400-Hz inputs, further control switches may be provided in each of the power lines.

A power supply 20 provides a reference potential, typically +15 vdc, for providing an independent power source of predetermined reference potential and polarity. The positive side of the supply is connected at node 22 through lead 24 to node 26 and then to terminal 14 of switch S1. Switch S1 is shown in the normally open position. In the closed position, switch arm 28 connects terminals 10 and 14 and switch arm 27 connects terminals 8 and 15 of switch S1 to provide continuity therethrough. Node 26 is further connected via lead 30 to load terminal 16'.

A first voltage divider is comprised of series connected resistors R1 and R2. R1 and R2 may also be comprised of a resistive voltage divider having a tap at an intermediate point 33. A first terminal 32 of resistor R1 is coupled via lead 34 to node 36 which in turn is connected to the input power terminal 12' and terminal 10 of switch S1. The common terminals of resistors R1 and R2 are tapped to provide a node 33 for providing a predetermined reference potential on lead 40 to an input 42 of detector U1. A second terminal at the free end 44 of resistor R2 is connected by means of lead 46 to the return side of power supply 20. Preferably a capacitor C1 is coupled across resistor R2 to reduce transients entering on the power line.

Resistors R3 and R4 form a second series connected voltage divider. The first terminal 48 of resistor R3 is connected through lead 50 to node 22 and power supply 20. Junction 52 of resistors R3 and R4 connects by means of lead 54 to a second input 56 of detector U1.

The output 58 of detector U1 is connected through LED 60, resistor R5, and isolator U2, to node 62, and along lead 63 to node 22 and power supply 20. Isolator U2 is preferably of the opto-isolator type, which, as is well known in the art, may be comprised of a light emitting diode and a photosensitive transistor. The output of the isolator U2 is provided on lines 64 and 66 to a remote indicator, not shown. Either the LED 60 or the isolator U2 or both may be used to indicate the switch position.

Typical component values of the various circuit elements are shown in Table 1.

In operation, the circuit functions by detecting a DC current flow from power supply 20 through the closed switch contacts 10 and 28 of switch S1. When switch S1 is in the open position as shown in the FIGURE, there is no current path through the open contacts 10,14,8, and 15 of the switch; hence, there is no voltage drop across voltage divider R1,R2. Thus there is a null voltage applied to terminal 42 of detector U1 with respect to the return side of power supply 20. The 15 vdc supply provided to resistive divider R3,R4 results in a positive voltage of 3.5 v at terminal 56 of detector U1. This causes detector U1, which may be a comparator logic element, to provide a logic high at the output terminal 58. Consequently, no current flows through isolator U2 and LED 60. The LED 60 remains unilluminated and there is no output on lines 64 and 66. This indicates that switch S1 is not closed. When lever arm 28 engages contact 10 and lever arm 27 engages contact 8 of switch S1, power is supplied from terminals 12 and 12' to the load 16 16'. The switch closure also results in applying +15 vdc from power supply 20 to terminal 32 of resistor R1. There is a return path through resistor R2 to the negative side of supply 20. This results in applying a voltage of +3.6 v with respect to ground to terminal 42 of detector U1. Since terminal 56 of detector U1 is biased to +3.5 v, the output 58 of detector U1 will go to a logic low, drawing current through optical isolator U2, resistor R5, and LED 60. Thus, LED 60 will be illuminated giving a visual indication that switch S1 is closed. The output of isolator U2 on leads 64 and 66 may be used to give a remote, isolated output signal to indicate switch closure. Resistor R5 limits the current flow to LED 60 and detector U1.

For proper operation of the circuit, the +15 vdc supply must be floating from the power input to switch S1. Thus, the circuit will indicate a switch closure whether or not power is applied at the switch input. The same circuit may also be used to indicate continuity from multiple power sources to a load through several switches to indicate remotely which power source is supplying the load. It is merely necessary to duplicate an additional detector and indicator with the associated bias network for each possible path. For this to function properly, the power sources must be DC isolated from each other with no common neutral, ground return, etc.

Capacitor C1 is used to filter any AC voltages appearing across switch S1 from affecting the DC potential supplied to detector U1.

While the invention has been described in its preferred embodiments, it is to be understood that the words which have been used are words of description rather than limitation and that changes may be made within the purview of the appended claims without departing from the true scope and spirit of the invention in its broader aspects.

TABLE 1

| COMPONENT VALUES | |
|---|---|
| $R_1$ | 150k |
| $R_2$ | 47k |
| $R_3$ | 120k |
| $R_4$ | 36k |
| $R_5$ | 1200 |
| $U_1$ | LM339 |
| $U_2$ | MCT-6 |
| $C_1$ | 10 uF |

I claim:

1. A circuit for sensing the operating position of a control switch for supplying electrical power to a load, said switch having a first terminal connected to a source of power and a second terminal connected to supply said load, comprising:
   (a) current source means for providing a unidirectional reference current of predetermined potential and polarity connected to said second terminal,
   (b) first voltage divider means coupled to said first terminal of said control switch and connected in parallel relationship to said current source means when said control switch is in an operative position with respect to said load, so that said voltage divider means provides a first predetermined reference potential when said control switch is in said operative position, and a null reference potential when said control switch is in an inoperative position with respect to said load,
   (c) second voltage divider means coupled in parallel relationship to said current source means for providing a second reference potential independent of the operative position of said control switch,
   (d) detector means, having an input and an output, said input coupled to receive said first and second reference potentials and responsive to differences thereof, a first difference potential corresponding to said operative position of said control switch and a second difference potential corresponding to said inoperative position of said control switch, said detector means so constructed and arranged as to provide a first logic level output corresponding to said operative position of said control switch and a second logic level corresponding to said inoperative position of said control switch, and
   (e) indicator means, coupled to said output of said detector means and responsive to said first or second logic levels, for providing an output indicative of said operative or inoperative position of said control switch.

2. The circuit as set forth in claim 1 wherein said detector means is comprised of comparator means having first and second oppositely poled inputs coupled respectively to said first and second voltage divider means for providing said first and second reference potentials.

3. The circuit as set forth in claim 2 wherein said first voltage divider means is comprised at least two series resistive elements, a tap at a juncture of said elements, said tap coupled to said first input of said detector means, and having a first terminal connected to said first terminal of said control switch and a second terminal connected to said current source means.

4. The circuit as set forth in claim 3 wherein said second voltage divider means is comprised of a further plurality of at least two series resistive elements, a tap at a junction of said further elements coupled to said second input of said detector means, and first and second terminals connected to receive said predetermined potential of said current source means.

5. The circuit as set forth in claim 4 further comprising a capacitor coupled in parallel disposition across one of said resistive elements of said first voltage divider means between said juncture and said second terminal.

6. The circuit as set forth in claim 5 wherein said indicator means is comprised of a light emitting diode coupled in series with said output or said detector means.

7. The circuit of claim 6 wherein said indicator means is further comprised of optical-isolator means having a light source responsive to said first and second logic levels and a further detector means responsive to said light source and electrically decoupled from said source of power so that said further detector means provides an isolated electrical output signal corresponding to said operative position of said control switch.

* * * * *